United States Patent [19]

Huang et al.

[11] Patent Number: 5,524,574
[45] Date of Patent: Jun. 11, 1996

[54] CONTROL OF OXYGEN CONCENTRATION IN SINGLE CRYSTAL PULLED UP FROM MELT CONTAINING GROUP-V ELEMENT

[75] Inventors: Xingming Huang, Ibaragi-ken; Kouji Izunome, 1770-1-502, Arakawaoki, Ami-machi, Inashiki-gun, Ibaragi-ken, 300-11; Kazutaka Terashima, 206-3, Nakano, Ebina-shi, Kanagawa-ken, 243-04; Yutaka Shiraishi, #D-202, Katohaitsu, 3-2-54, Nanbara, Hiratsuka-shi, Kanagawa-ken, 254; Hitoshi Sasaki, #A-101, Kawamurahaitsu, 2-42-2, Kasuga, Tsukuba-shi, Ibaragi-ken, 305; Shigeyuki Kimura, Ibaragi-ken, all of Japan

[73] Assignees: Research Development Corporation of Japan, Tokyo; Kouji Izunome, Ibaragi-ken; Kazutaka Terashima; Yutaka Shiraishi, both of Kanagawa-ken; Hitoshi Sasaki, Ibaragi-ken, all of Japan

[21] Appl. No.: 291,833

[22] Filed: Aug. 17, 1994

Related U.S. Application Data

[63] Continuation of Ser. No. 214,470, Mar. 18, 1994, abandoned.

[30] Foreign Application Priority Data

| Mar. 29, 1993 | [JP] | Japan | 5-069924 |
| Dec. 28, 1993 | [JP] | Japan | 5-335355 |
| Dec. 28, 1993 | [JP] | Japan | 5-335356 |
| Dec. 28, 1993 | [JP] | Japan | 5-335357 |
| Dec. 28, 1993 | [JP] | Japan | 5-335358 |

[51] Int. Cl.$^6$ ............................... C30B 15/20
[52] U.S. Cl. ............................... 117/20; 117/916
[58] Field of Search ............................... 117/18, 19, 20, 117/33, 35, 916, 928, 937, 942, 944

[56] References Cited

U.S. PATENT DOCUMENTS

| 4,400,232 | 8/1983 | Ownby et al. | 117/15 |
| 4,417,943 | 11/1983 | Jacques et al. | 117/15 |
| 4,936,949 | 6/1990 | Kida et al. | 117/31 |
| 5,073,229 | 12/1991 | Yamashita et al. | 117/21 |
| 5,152,867 | 10/1992 | Kitaura et al. | 117/20 |
| 5,260,037 | 11/1993 | Kitaura et al. | 117/217 |
| 5,270,020 | 12/1993 | Suzuki et al. | 117/31 |
| 5,392,729 | 2/1995 | Kuramochi et al. | 117/20 |

FOREIGN PATENT DOCUMENTS

| 0435440 | 7/1991 | European Pat. Off. | 117/20 |
| 5-238883 | 9/1993 | Japan . | |

*Primary Examiner*—Felisa C. Garrett
*Attorney, Agent, or Firm*—Beveridge, DeGrandi, Weilacher & Young

[57] ABSTRACT

The amount of Group-V element included in a melt 6 has the close relationship with the oxygen concentration of the melt 6. This relationship is utilized for controlling the oxygen concentration of a single crystal 8 at a high level. The content of Group-V element is calculated from the weight of the melt 6 gauged by a gravimeter 11 and compared with a preset value in a control unit 12. When the calculated content is smaller than the preset value, the control signal to additionally supply Group-V element to the melt 6 is outputted from the control unit 12 to a feeder 14. When the calculated content is larger than the preset value, the control signal to supply a raw material to the melt 6 is outputted to another feeder 13.

5 Claims, 10 Drawing Sheets

CONTROL OF OXYGEN CONCENTRATION IN SINGLE CRYSTAL PULLED UP FROM MELT CONTAINING GROUP-V ELEMENT

This application is a continuation of application Ser. No. 08/214,470, filed Mar. 18, 1994, now abandoned which application is entirely incorporated herein by reference.

INDUSTRIAL APPLICATION OF THE INVENTION

The present invention relates to a pull method of producing a single crystal having oxygen concentration properly controlled from a melt containing Group-V element, and also relates to an apparatus useful for said pull method.

BACKGROUND OF THE INVENTION

Czochralski method is a representative method for the growth of a single crystal from a melt.

Figure 1:
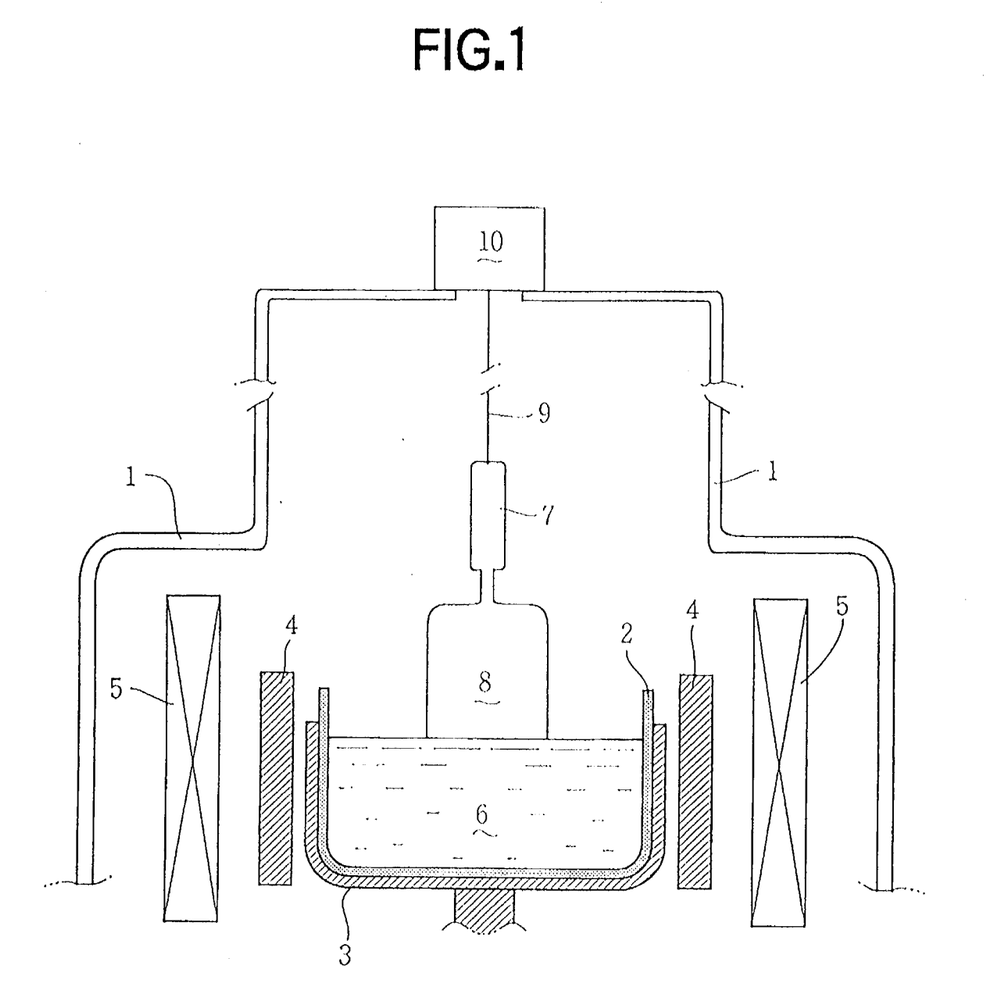
FIG. 1 is a schematic view illustrating an apparatus for pulling up a single crystal from a melt according to Czochlarski method.

Czochralski method uses a crucible 2 provided in a closed chamber 1 as shown in FIG. 1. The crucible 2 is supported by a support 3 so that the crucible 2 is capable of rotation and/or vertical motion. There are concentrically disposed a heater 4 and a heat insulator 5 around the crucible 2.

A raw material is received in the crucible 2 and intensively heated by the heater 4 to prepare a melt 6. The melt 6 is held at a temperature suitable for the growth of a single crystal.

When a seed crystal 7 being hung from a rotary winder 10 through a wire 9 is brought into contact with the melt 6, a single crystal 8 grows on the seed crystal 7 so that the crystalline orientation of the seed crystal 7 is transferred to that of the growing crystal 8. The seed crystal 7 is then rotatingly pulled up in response to the growth of the single crystal 8. The crucible 2 is descendingly rotated by the rotating motion of the support 3, too.

The obtained single crystal 8 is sliced to wafers useful as substrates for electronic devices.

When the melt 6 to which Sb is added as a type-n dopant is used for crystal growth, an obtained single crystal 8 is useful as a high-conductivity semiconductor material because of containing Sb. Oxygen originated in $SiO_2$ dissolved from the crucible 2 into the melt 6 is included in the single crystal 8, too.

Oxygen atoms included in the single crystal 8 precipitate in a bulk and form crystalline faults, when the single crystal 8 is heat treated. The crystalline faults are utilized as a gettering center for capturing heavy metal impurities remaining on the surface of a semiconductive single crystal substrate comprising an electronic device. Hereby, the heavy metal impurities are made harmless. Dissolved oxygen atoms are effective for enhancing the strength of the single crystal substrate, too. In this regard, it is preferable to increase oxygen concentration in the melt, in order to increase an amount of oxygen included in the single crystal 8. However, it is difficult to keep the oxygen concentration in the melt at a high level under a stable condition.

SUMMARY OF THE INVENTION

An object of the present invention is to increase oxygen concentration in a melt suitable for the growth of a single crystal whose oxygen concentration is adjusted at a higher level.

Another object of the present invention is to control oxygen concentration in a melt by an amount of Group-V element added to the melt, utilizing the phenomenon that the oxygen concentration in the melt becomes higher in response to the amount of Group-V element.

Still another object of the present invention is to properly control the diffusion of oxygen as oxides from the surface of a melt by changing atmospheric conditions, so that oxygen concentration in the melt is maintained within a predetermined range.

According to the present invention, Group-V element in a relatively large amount is added to a melt, and the oxygen concentration of the melt is controlled by the amount of the Group-V element.

When Sb is used as Group-V element, Sb in an amount above $1.0 \times 10^{-4}$ atm. % is added to a Si melt. Sb content in the Si melt is calculated by weighing the melt by a gravimeter. For instance, a load sensor such as a differential transformer is connected to a stand for supporting a crucible, to real-on-time weigh the melt received in the crucible. On the other hand, an amount of Sb added to the Si melt and an amount of Sb evaporated from the Si melt are detected by proper means. An amount of Sb, i.e. Sb content, included in the Si melt is calculated on the basis of the difference between these detected values.

The Sb content obtained in this way is compared with a predetermined value corresponding to an objective oxygen concentration. The comparison result is used for controlling the amount of Sb to be added to the Si melt and/or the amount of Sb evaporated from the Si melt to properly control Sb content in the Si melt. Hereby, the real Sb content gets near the predetermined value, so that oxygen concentration in the melt is adjusted to an objective value.

When the other Group-V element, e.g. P, As or Bi, is added to the melt, the amount of the element included in the melt is calculated in the same way. Oxygen concentration in the melt is adjusted at a proper level by controlling the amount of the element in the melt.

The evaporation of Group-V element from the melt may be controlled by the pressure of the atmosphere to which the melt is exposed. In this case, the melt contains Group-V element in an amount of $1.0 \times 10^{-4}$ atm. % or more, and the oxygen concentration C in the upper layer of the melt is defined by the formula (1) of:

$$C = 2.08 \times 10^{18} - K \times \left( \frac{4.33 \times 10^{23}}{P^2 + 2.89 \times 10^5} + \frac{2.95 \times 10^{23}}{P^2 + 9.97 \times 10^5} \right) \quad (1)$$

The formula (1) is determined from a lot of our experiments. In the formula (1), P is an atmospheric pressure, and K is a constant defined by the kind of atmospheric gas and a doping level. For instance, when a doping level is $1.0 \times 10^{-4}$ atm. % or more, the constant K is 1.00–1.24 as for Ne, 0.85–1.05 as for Ar, 0.64–0.80 as for Kr, 0.42–0.59 as for Xe or 0.30–0.38 as for Rn. Herein, JEIDA calculated value (3.03) is used as oxygen concentration.

Oxygen concentration can be controlled more accurately, when the flow speed V of the atmospheric gas is incorporated as a control factor. In this case, the pressure P (torr.) is controlled by the flow speed V according to the formula (2) of:

$$P = f/V \quad (2)$$

wherein f is a factor within the range of $1.0 \times 10^3 - 3.5 \times 10^5$ determined by the diameter of a crucible.

The relationship of the pressure P with oxygen concentration is applicable to a Si melt doped with any of P, As, Sb or Bi. Taking into consideration the relationship between an amount of Group-V element and oxygen concentration in the melt, P or As content is preferably held at $1.0 \times 10^{-4}$ atm. % or more, and Sb or Bi content is preferably held at 0.01 atm. % or more.

The evaporation of Group-V element from the melt may be controlled by selecting the kind of an atmospheric gas to which the melt is exposed. In this case, the melt contains Group-V element in an amount of $1.0 \times 10^{-4}$ atm. % or more. When a single crystal having oxygen concentration of $9.0 \times 10^{17}$ atoms/cm$^3$ or more is to be grown from the melt, a rare gas, e.g. Kr, Xe or Rn, having a larger mass is used as the atmospheric gas. When a single crystal having oxygen concentration of $(3.0–9.0) \times 10^{17}$ atoms/cm$^3$ is to be grown from the melt, a rare gas, e.g. Ne or Ar, having a smaller mass is used as the atmospheric gas.

The evaporation of Group-V element may be controlled by the composition of the atmospheric gas, too. In concrete, when a single crystal having oxygen concentration of $9.0 \times 10^{17}$ atoms/cm$^2$ or more is to be grown from the melt, a rare gas, e.g. Kr, Xe or Rn, having a larger mass is mixed in Ar gas. When a single crystal having oxygen concentration of $9.0 \times 10^{17}$ atoms/cm$^3$ or smaller is to be grown from the melt, a rare gas, e.g. Ne or Ar, having a smaller mass is mixed in Ar gas.

An apparatus for the growth of a single crystal according to the present invention comprises a chamber for defining the single crystal growth zone wherein a single crystal is pulled up from a melt received in a crucible, a gas conduit for connecting the interior of the chamber to a gas source for supplying rare gases such as Ne, Ar, Kr, Xe and/or Rn, a detector for detecting the partial pressure of oxygen in the chamber, a pressure gauge for gauging an atmospheric pressure in the chamber, a control unit for calculating oxygen concentration in the upper layer of the melt on the basis of detected values from the detector and the pressure gauge to output an atmospheric pressure corresponding to the difference between the calculated oxygen concentration and an objective value, and a regulator valve provided in the gas conduit. The regulator valve is operated by a control signal corresponding to the atmospheric pressure supplied from the control unit.

A different kind of rare gas may be supplied to the chamber by changing the regulator valve, or a rare gas having a larger or smaller mass may be additionally supplied to the chamber. For instance, since the chamber is usually filled with Ar gas, the kind and/or amount of rare gas to be mixed in Ar gas may be changed in response to objective oxygen concentration in a single crystal to be obtained. In this case, an additional gas conduit connected to a rare gas supply source other than Ar is opened to a part of a main Ar gas conduit, and another regulator valve is provided in the additional gas conduit. A control signal is inputted from the control unit to the another regulator valve. When oxygen concentration in the upper layer of the melt calculated from the values detected by the detector and the pressure gauge is higher than an objective value, He or Ne is supplied through the additional gas conduit and then the main gas conduit to the chamber. When the calculated oxygen concentration is lower than the objective value, Kr or Xe is supplied in the same way.

The melt which has the tendency to change oxygen concentration at its upper layer according to the atmospheric condition is representatively a Si melt containing Group-V element in a relatively large amount. The same tendency is also recognized in other melts, e.g. the Si or Ge melts to which other dopants are added.

Other features of the present invention will be apparent from the following description using a Si melt containing Sb. However, the following desciption is nothing but embodiments, and does not put any restrictions on the scope of the present invention.

DETAILED DESCRIPTION OF THE PREFERRED EMBODIMENTS

A single crystal pulled up from an Sb-doped Si melt exhibits high conductivity due to Sb doping. In a conventional method, oxygen concentration in the Sb-doped Si single crystal was remarkably reduced in response to the increase of Sb content. In the course of our research and investigation on the effect of Sb added to the Si melt, we have found that the oxygen concentration of the Si melt apparently becomes higher in response to the increase of Sb content. On the other hand, Sb content in an Sb-doped Si single crystal prepared by a conventional method was approximately 0.5 atm. % at most, so that the effect of Sb on the increase of oxygen content was rarely noticed.

A semiconductor material made from the Si single crystal contains oxygen atoms at the rate of $3 \times 10^{18}–1 \times 10^{19}$ atoms/cm$^3$, so that it will be used as a type-n high-conductive substrate. When the material is annealed, minute precipitation faults are formed in the bulk with uniform distribution. Consequently, the material is useful as a substrate for an electronic device such as a power transistor or a bipolar transistor.

Since the semiconductor material is made from the Sb-doped Si single crystal having high oxygen concentration, it has the excellent gettering property to effectively capture heavy metal impurities with the suppressed leakage of electricity. In addition, the reliability of the semiconductor material on its quality is very high, since oxygen concentration is controlled within a predetermined narrow range.

Figure 3:
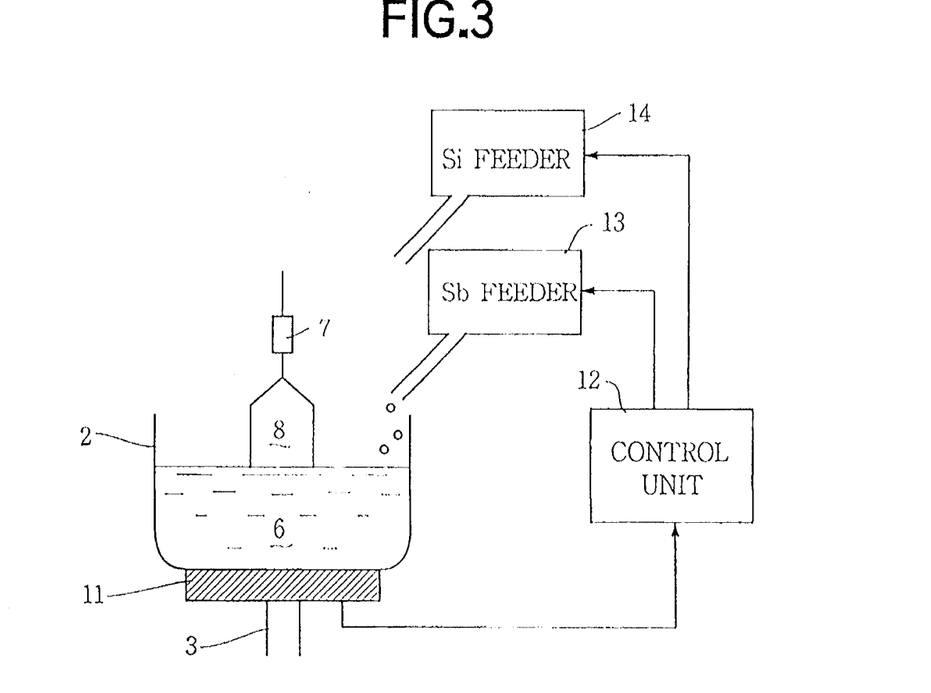
FIG. 3 is a schematic view illustrating an apparatus for supplying controlled amounts of Si and Sb.

A system for controlling the oxygen concentration of a melt on the basis of Sb content has a load sensor 11 provided between the crucible 2 and the support 3, as shown in FIG. 3. The weight of the melt 6 detected by the load sensor 11 is outputted to a control unit 12. In the control unit 12, Sb content in the melt 6 is calculated from the detected weight and compared with a predetermined Sb value.

When the calculated Sb content is smaller than the predetermined value, a control signal is outputted from the control unit 12 to an Sb feeder. Hereby, Sb is supplied to the melt 6 in a proper amount to increase Sb content near the predetermined value. When the calculated Sb content is larger than the predetermined value, a control signal is outputted to a Si feeder 14 so that a proper amount of Si is supplied to the melt 6 to reduce the Sb content near the predetermined value. Hereon, the melt 6 may be held at a high temperature for a proper time to reduce the Sb content near the predetermined value, since Sb is a volatile element.

Figure 2:
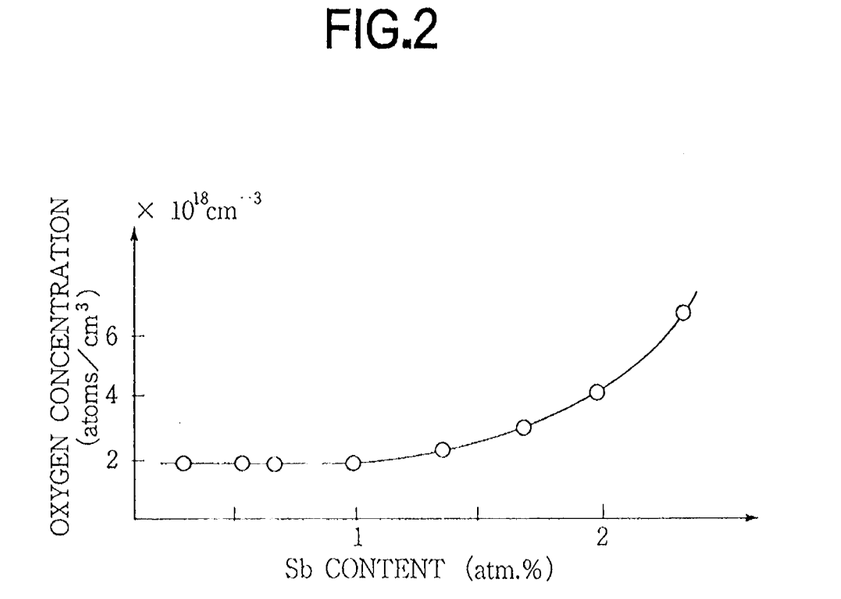
FIG. 2 is a diagram illustrating the relationship between the Sb content and oxygen concentration in example 1.

When Sb content in the melt 6 is adjusted to the predetermined value in this way, the oxygen concentration of the melt 6 is controlled at a level corresponding to the predetermined Sb value as shown in FIG. 2. The conditioned melt 6 is suitable for the growth of an Sb-doped single crystal 8 having high oxygen concentration. A semiconductor material made from the single crystal 8 has the gettering property to effectively capture heavy metals with the suppressed leakage of electricity.

The oxygen concentration of a Si single crystal pulled up from a Si melt not only depends on the dissolution of oxygen from a crucible into the melt and the oxygen concentration of the melt, but also depends on the diffusion of oxygen as oxides from the surface of the melt to the atmosphere. Since the surface of the melt is exposed to the atmospheric gas, a large amount of oxygen is removed from the surface layer of the melt by the flow of the atmospheric gas. Hereby, the oxygen concentration in the upper layer of the melt is not held at a constant level. The diffusion of oxygen from the surface of the melt containing Group-V element is actively promoted, since the oxide of Group-V element has a big vapor pressure. In this regard, the diffusion of oxygen from the melt to the atmosphere can be controlled by atmospheric conditions, e.g. the pressure of the atmosphere, the kind of rare gas used for the atmosphere, the composition of atmospheric gas and so on.

We suppose the pressure of the atmosphere has the effect on the oxygen concentration of the melt as follows:

Presume a single crystal is pulled up from a Si melt held in an atmosphere filled with ideal gas. The frequency f that a molecular evaporated from the surface of the melt comes into collision with a gaseous molecular in the atmosphere has the relationship of f∝p² with an atmospheric pressure P. When the collision frequency f is larger, the evaporation of the molecular from the surface of the melt is suppressed. Hereby, the diffusion of oxygen from the surface of the melt is quantitatively reduced.

Especially when the Si melt doped with Group-V element is used for crystal growth, the dopant is evaporated as the element itself and its oxide. The evaporated substance exhibits a higher vapor pressure compared with SiO in a relatively lower temperature zone below 1500° C. Owing to the higher vapor pressure, the atmospheric pressure has a larger effect on the evaporation of Group-V element from the melt. When the pressure P is held at a higher value, the diffusion of oxygen to the atmosphere is suppressed so that the upper layer of the melt is maintained at a higher oxygen concentration level. A single crystal obtained from said melt has higher oxygen concentration. When the pressure P is held at a lower level, the diffusion of oxygen from the melt is promoted so that a single crystal obtained from the melt has relatively lower oxygen concentration.

Oxygen concentraion in the upper layer of the Si melt is determined by the amount of oxygen diffused from the melt as well as the oxygen concentration of the melt itself. The oxygen concentration reduced by the diffusion as well as the oxygen concentration of the melt itself are in reverse proportion to the square of the pressure P. According to our research and investigation, there is experimentally recognized the presence of the relationship defined by the formula (1) between the atmospheric pressure P and the oxygen concentration C in the upper layer of the melt.

$$C = 2.08 \times 10^{18} - K \left( \frac{4.33 \times 10^{23}}{P^2 + 2.89 \times 10^5} + \frac{2.95 \times 10^{23}}{P^2 + 9.97 \times 10^5} \right) \quad (1)$$

The pressure P required for the controlled diffusion of oxygen may be adjusted by changing the flow speed V according to the formula (2) based on Boyle-Charles' law.

$$P \cdot f/V \quad (2)$$

In short, the oxygen concentration of a single crystal to be pulled up from the melt can be adjusted at a predetermined value by controlling the atmospheric pressure P and the flow speed V of an atmospheric gas as occasion demands.

For instance, a semiconductor material containing oxygen in an amount of $(0.3-1.0) \times 10^{18}$ atoms/cm³ is obtained from the Si single crystal which has been pulled up from a Si melt containing 0.001 atm. % or more of Sb. The semiconductor material is type-n with high conductivity, and minute precipitation faults are formed with uniform distribution in a bulk after being annealed. Consequently, the semiconductor material is useful as a substrate for an electronic device such as a power transistor or a bipolar transistor. The same effect of oxygen concentration on the property of the semiconductor material is obtained, when the other Group-V element, e.g. P, As or Bi, is added as a dopant to the melt.

The oxygen concentration may be controlled by changing the kind of a rare gas having a different mass. We suppose the kind of a rare gas effects on the oxygen concentration as follows:

Presume a single crystal is pulled up from a Si melt held in an atmosphere filled with ideal gas. The frequency f that a molecular evaporated from the surface of the melt comes into collision with a gaseous molecular in the atmosphere is in reverse proportion to the square root of the mass $m_g$ of an atmospheric gas. A collision energy E has the relationship of $E = K \cdot m_g$ with the mass $m_g$ wherein K is a constant. Consequently, the collision of an element evaporated from the melt with the gaseous element of the atmosphere is proportional to the square root of the mass $m_g$.

Hence, the evaporation of an element from the surface of the melt is suppressed by using a rare gas having a larger mass than that of Ar which is ordinarily used as an atmospheric gas for pulling up a single crystal. As a result, the evaporation of oxides from the melt is reduced, so as to hold the oxygen concentration of the melt including its surface layer at a higher level. On the contrary, a single crystal having relatively lower oxygen concentration can be obtained by using a rare gas having a smaller mass than that of Ar. The effect of the kind of a rare gas is apparent especially when a Si melt doped with Group-V element is used for the growth of a single crystal, since the oxide of Group-V element shows a higher vapor pressure than that of SiO at a temperature of 1500° C. or lower.

The mass effect of the rare gas may be realized not only by changing the kind of the rare gas but also by changing the amount of a rare gas to be mixed in Ar which is ordinarily used as an atmospheric gas for the growth of a single crystal.

When the atmospheric conditions are utilized to control the oxygen concentration of a single crystal to be obtained, the relationship of the atmospheric conditions, e.g. the atmospheric pressure or the composition of the atmospheric gas, with an objective oxygen value is preparatively investigated. The atmospheric pressure, oxygen concentration, oxygen partial pressure, etc. are detected during the growth of a single crystal. The atmospheric conditions are changed on the basis of the detection results in such a manner to approach an objective oxygen value. Hereby, the oxygen concentration in the upper layer of the melt is held at a constant level, so that a single crystal obtained from the melt has oxygen concentration sufficiently stabilized to assure excellent reliability on quality.

Figure 4:
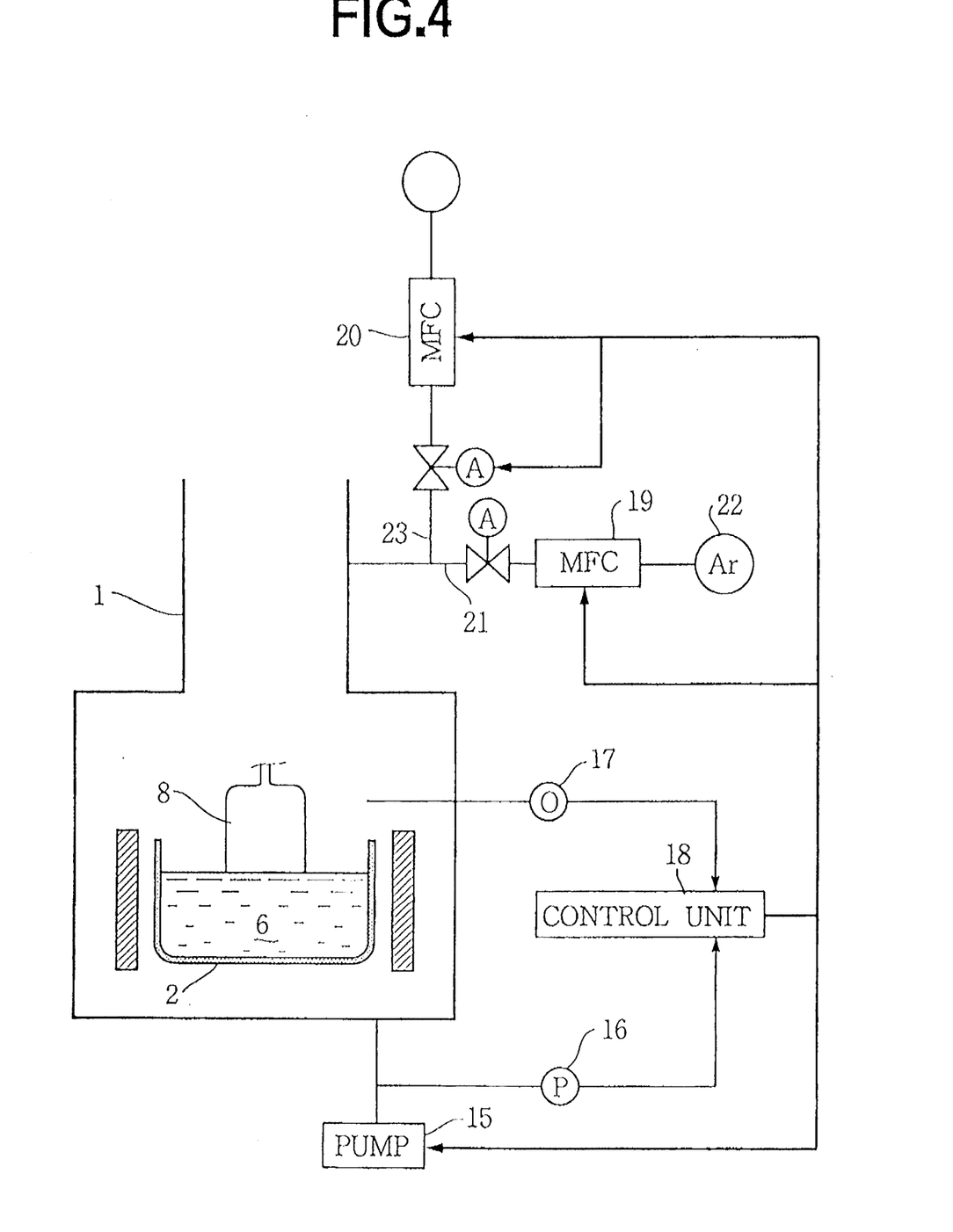
FIG. 4 is a schematic view illustrating an apparatus for controlling atmospheric conditions.

The atmospheric conditions for the growth of a single crystal is performed using a system shown in FIG. 4 for instance. A crucible 2 for receiving the melt 6 from which a single crystal 8 is to be pulled up is located in a vacuum chamber 1. A suction pump 15 is connected to the chamber 1 to maintain the interior of the chamber 1 under a predetermined evacuated condition. A pressure gauge 16 for detecting the internal pressure of the chamber 1 is provided in an exhaust pipe extending from the chamber 1 to the suction pump 15. An oxygen sensor 17 serving as a detector for detecting the partial pressure of oxygen in the internal atmosphere has a detection terminal extending near the surface of the melt 6.

The partial pressure of oxygen detected by the oxygen sensor 17 together with the atmospheric pressure detected by the pressure gauge 16 is inputted to a control unit 18. Presuming that the transfer of oxygen is in equilibrium over the whole passage including the dissolution of the crucible 2 during the crystal growth, the inclusion of oxygen in the growing single crystal and the diffusion of oxygen into the atmosphere, oxygen concentration $C_2$ in the upper layer of the melt 6 is defined by the formula of $C_2=C_1-C_{ev}$, according to diffusion theory, wherein $C_1$ is the oxygen concentration of the melt 6 itself, and $C_{ev}$ is the concentration of oxygen diffused from the surface of the melt 6.

An ideal gas has the proportional relationship between the oxygen partial pressure $P_o$ detected by the oxygen sensor 17 and the concentration $C_{ev}$ of duffusing oxygen, so that the concentration $C_{ev}$ of diffusing oxygen is represented by the formula of $C_{ev}=k \cdot P_o$ wherein k is a constant within the range of $(1.0-9.0) \times 10^{16}$ torr·atoms/cm$^3$. On the other hand, the oxygen concentration $C_2$ has the relationship defined by the formula (3) with the atmospheric pressure P.

$$C_2 = 2.08 \times 10^{18} - K \left( \frac{4.33 \times 10^{23}}{P^2 + 2.89 \times 10^5} + \frac{2.95 \times 10^{23}}{P^2 + 9.97 \times 10^5} \right) \quad (3)$$

The formula (3) is experimentally recognized by our research and investigation. Hereby, the oxygen concentration $C_2$ in the upper layer of the melt is calculated using the oxygen partial pressure $P_o$ and the atmosphric pressure P as parameters according to the formula (4) of:

$$C_2 = 2.08 \times 10^{18} - K \left( \frac{4.33 \times 10^{23}}{P^2 + 2.89 \times 10^5} + k \cdot P_o \right) \quad (4)$$

The control unit 18 calculates the oxygen concentration $C_2$ in the upper layer of the melt during the growth of a single crystal from the oxygen partial pressure $P_o$ and the atmospheric pressure P. The calculation result is compared with an objective oxygen value preset in the control unit 18. The difference between the calculation result and the objective value is converted to a control signal representing a proper atmospheric pressure and optionally another control signal representing the composition of the atmospheric gas by the control unit 18. The control signals are outputted to the suction pump 15 and regulator valves 19, 20, respectively.

The regulator valve 19 is provided in a gas conduit 21 extending from an Ar supply source 22, to control the flow amount of Ar gas to be supplied to the chamber 1. The other regulator valve 20 is provided in a gas conduit 23 extending from another rare gas supply source 24. The gas conduit 23 is opened to the former gas conduit 21 at a proper position.

The rotation of the suction pump 15 and the opening rate of the regulator valve 16 are controlled by the control signals outputted from the control unit 18, so as to maintain the interior of the chamber 1 at an atmospheric pressure corresponding to objective oxygen concentration. When the composition of the atmospheric gas is to be changed, the opening rate of the regulator valve 20 is adjusted by the control signal outputted from the control unit 18. Hereby, a rare gas, e.g. He, Ne, Kr or Xe, other than Ar is supplied to the chamber 1 at a different flow rate.

The atmospheric pressure and/or the composition of the atmospheric gas can be on-line controlled in response to the conditions during the growth of the single crystal 8. Consequently, the oxygen concentration in the upper layer of the melt 6 is kept at a proper value with high accuracy, and the obtained single crystal 8 has oxygen concentration stabilized at a high level. The oxygen concentration in the Si single crystal 8 is controlled at a proper value over a broad range of $3 \times 10^{17}$–$1.5 \times 10^{18}$ atoms/cm$^3$. Especially, a single crystal pulled up from a Si melt doped with Sb has oxygen concentration stabilized at a higher level.

EXAMPLE 1

Pure Si 20 g was received in a crucible of 50 mm in diameter and 60 mm in height, and heated with a difference of 50° C. in temperature distribution along a vertical direction so as to hold the surface of a melt at 1450° C. After the Si melt was held for 30 min. under this temperature condition, pure Sb in predetermined amount was added to the melt. The melt was further held for 30 min. under the same temperature condition. Thereafter, the melt was cooled to 1350° C. at a cooling speed of 200° C./hr. and then to a room temperature at a cooling speed of 50° C./hr. A plurality of Si materials doped with Sb in objective amounts of 1, 2, 3 and 5 atm. % were prepared in this way.

Each of pure Si and Sb-doped Si was heated at 1426°–1542° C. in an Ar atmosphere, and held for 90 min. at the same temperature before the start of operations for the growth of a single crystal from each melt. Each of the obtained single crystals was sliced to a test piece of 2 mm in thickness. The oxygen concentration of the test piece was detected by SIMS method.

Table 1 shows the relationship between the detected oxygen concentration and Sb content in the test piece. It is noticed from Table 1 that the oxygen concentration becomes larger as the increase of Sb content. Thus, the relationship shown in FIG. 2 between the Sb content and oxygen concentration of Si melts held at 1420° C. was obtained from various experimental data.

TABLE 1

RELATIONSHIP BETWEEN Sb CONTENT
AND OXYGEN CONCENTRATION

| TEST No. | TEMP. (°C.) | Sb Content (atm. %) Objective Value | Sb Content (atm. %) Real Value | Oxygen Concentration (× 10$^{18}$ atoms/cm$^3$) |
|---|---|---|---|---|
| 1 | 1447 | 0 | 0 | 2.08 |
| 2 | 1491 | 0 | 0 | 2.08 |
| 3 | 1542 | 0 | 0 | 2.29 |
| 4 | 1428 | 1.0 | 0.44* | 2.52 |
| 5 | 1443 | 1.0 | 0.09 | 2.46 |
| 6 | 1456 | 1.0 | 0.19* | 2.21 |
| 7 | 1473 | 1.0 | 0.30 | 2.00 |
| 8 | 1505 | 1.0 | 0.49 | 1.92 |
| 9 | 1443 | 2.0 | 0.80 | 2.23 |
| 10 | 1506 | 2.0 | 0.63* | 2.46 |
| 11 | 1426 | 3.0 | 1.47 | 2.46 |
| 12 | 1472 | 3.0 | 1.31* | 3.06 |
| 13 | 1443 | 5.0 | 2.00* | 8.65 |
| 14 | 1505 | 5.0 | 1.91 | 19.48 |

NOTE:
The values marked with (*) were directly detected by ICP-AES, while the other values were calculated from the data of ICP-AES and SIMS.

The Si melt to which Sb was added in the same way was held at various temperatures to testify the dependency of oxygen concentration on the temperature. The result is shown in FIG. 5.

Figure 5:
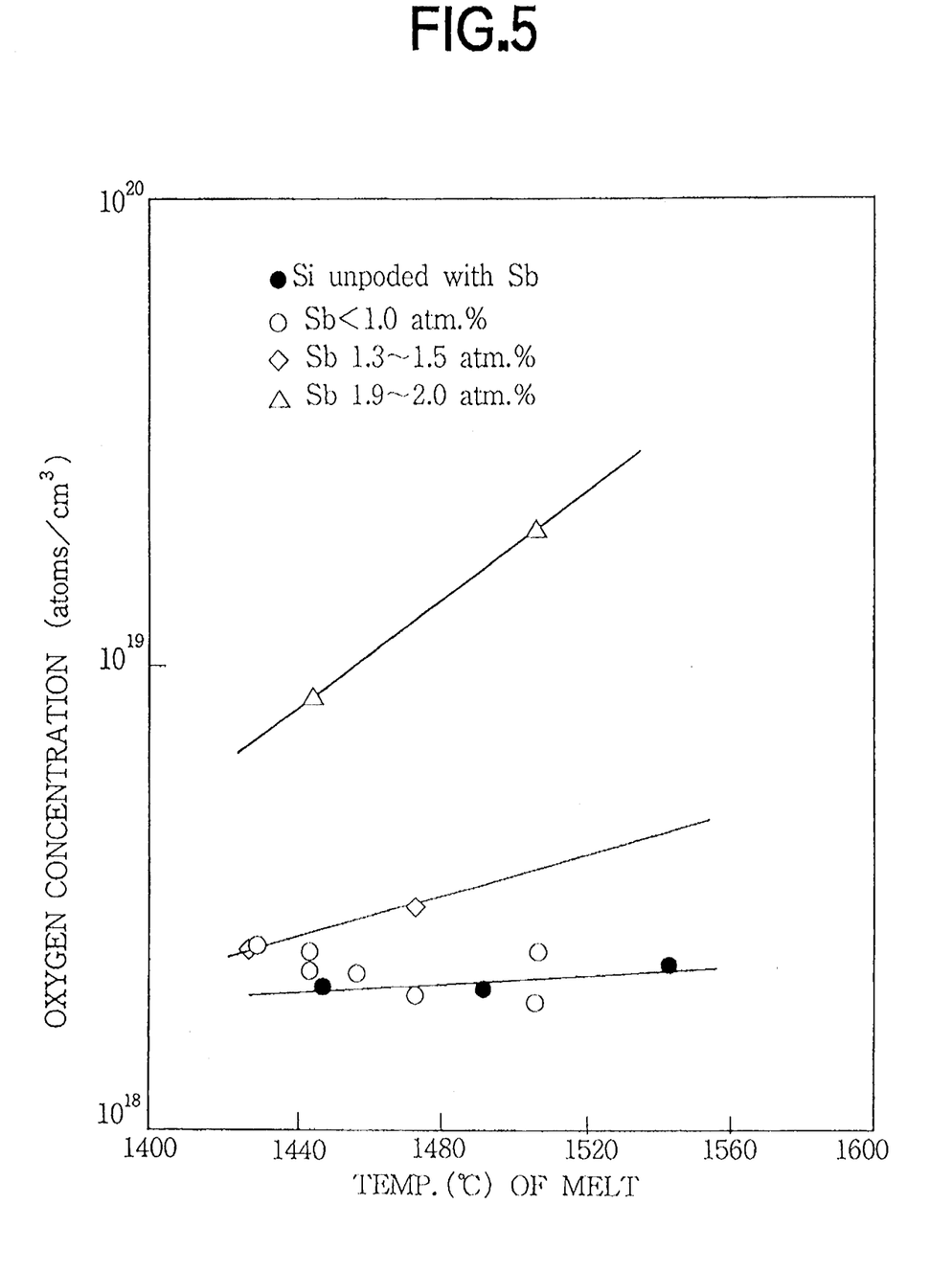
FIG. 5 is a diagram illustrating the relationship between the temperature and oxygen concentration of a Si melt in Example 1.

It is noticed from FIG. 5 that oxygen concentration becomes larger, as a Si melt containing 1.3 atm. % or more of Sb is held at a higher temperature. Especially in the Si melt containing Sb in a large amount of 1.9–2.0 atm. %, the temperature of the melt put the clear effect on the oxygen concentration. However, the deviation of oxygen concentration in response to the temperature became smaller as the reduction of Sb content less than 1 atm. % within the temperature range of 1426°–1542° C.

Since the Si melt for the growth of a single crystal had high oxygen concentration, the interior of the chamber shall be held at a pressure sufficiently high to suppress the diffusion of oxides from the melt. The high internal pressure was effective for stabilizing the surface of the melt, too. For instance, the melt was exposed to an Ar atmosphere of 0.8 bar., while an atmospheric pressure for the ordinary growth of a single crystal is approximately 0.04 bar.

A semiconductor substrate made from the single crystal obtained in this way was high of oxygen concentration excellent in the effect to make heavy metal impurities harmless. Consequently, an electronic device formed on the semiconductor substrate had excellent properties, e.g. low junction leakage of electricity and prolonged life time of carriers, which had not been observed in a device using a low-oxygen substrate prepared in a conventional method.

EXAMPLE 2

Pure Si 20 g was received in a crucible of 50 mm in diameter and 60 mm in height, and heated under the same temperature condition as that in Example 1. After the Si melt was held for 30 min. under this temperature condition, pure Sb 0.7 g was added to the melt. The melt was further hold for 30 min. under the same temperature condition to prepare a Si melt doped with Sb in an objective amount of 0.8 atm. %.

A single crystal was pulled up from the Sb-doped Si melt in an Ar atmosphere while variously changing the atmospheric pressure P. Each obtained single crystal was sliced to a test piece of 2 mm in thickness, and the oxygen concentration of the test piece was detected by SIMS method. Table 2 shows the oxygen concentration $C_3$ of each test piece in comparison with the oxygen concentration $C_1$ of the melt itself and the oxygen concentration $C_2$ of its upper layer. The value $C_1$ was obtained from a rapidly solidified Si bulk by the same SIMS method. The value $C_2$ was calculated from the oxygen partial pressure of the atmosphere detected by the oxygen sensor 17 having a detection terminal near the surface of the melt.

TABLE 2

OXYGEN CONCENTRATION (Atoms/cm$^3$ × 10$^{17}$)
OF MELT ITSELF, ITS UPPER LAYER
AND OBTAINED SINGLE CRYSTAL

| Pressure Of Ar Atmosphere (torr.) | Oxygen Concentration $C_1$ | Oxygen Concentration $C_2$ | Oxygen Concentration $C_3$ | Dependency $C_3/C_1$ | Dependency $C_3/C_2$ |
|---|---|---|---|---|---|
| 10 | 5.0 | 2.1 | 2.5 | 0.50 | 1.19 |
| 30 | 5.1 | 2.1 | 2.6 | 0.51 | 1.24 |
| 50 | 5.2 | 2.2 | 2.7 | 0.52 | 1.23 |
| 100 | 5.5 | 2.6 | 3.0 | 0.55 | 1.15 |
| 200 | 8.8 | 4.0 | 4.8 | 0.88 | 1.20 |
| 500 | 12.0 | 9.6 | 11.7 | 0.98 | 1.22 |
| 760 | 15.0 | 13.1 | 15.3 | 1.02 | 1.17 |

NOTE:
$C_1$ represents the oxygen concentration of the melt itself.
$C_2$ represents the oxygen concentration of the upper layer.
$C_3$ represents the oxygen concentration of the single crystal.

It is noticed from Table 2 that the ratio $C_3/C_2$ was held within the narrow range of 1.15–1.24, while the ratio $C_3/C_1$ was deviated over the broad range of 0.50–1.02. As a result, it is recognized that the oxygen concentration $C_3$ of the obtained single crystal mainly depends on the oxygen concentration $C_2$ in the upper layer of the melt but not on the oxygen concentration $C_1$ of the melt itself.

Figure 6:
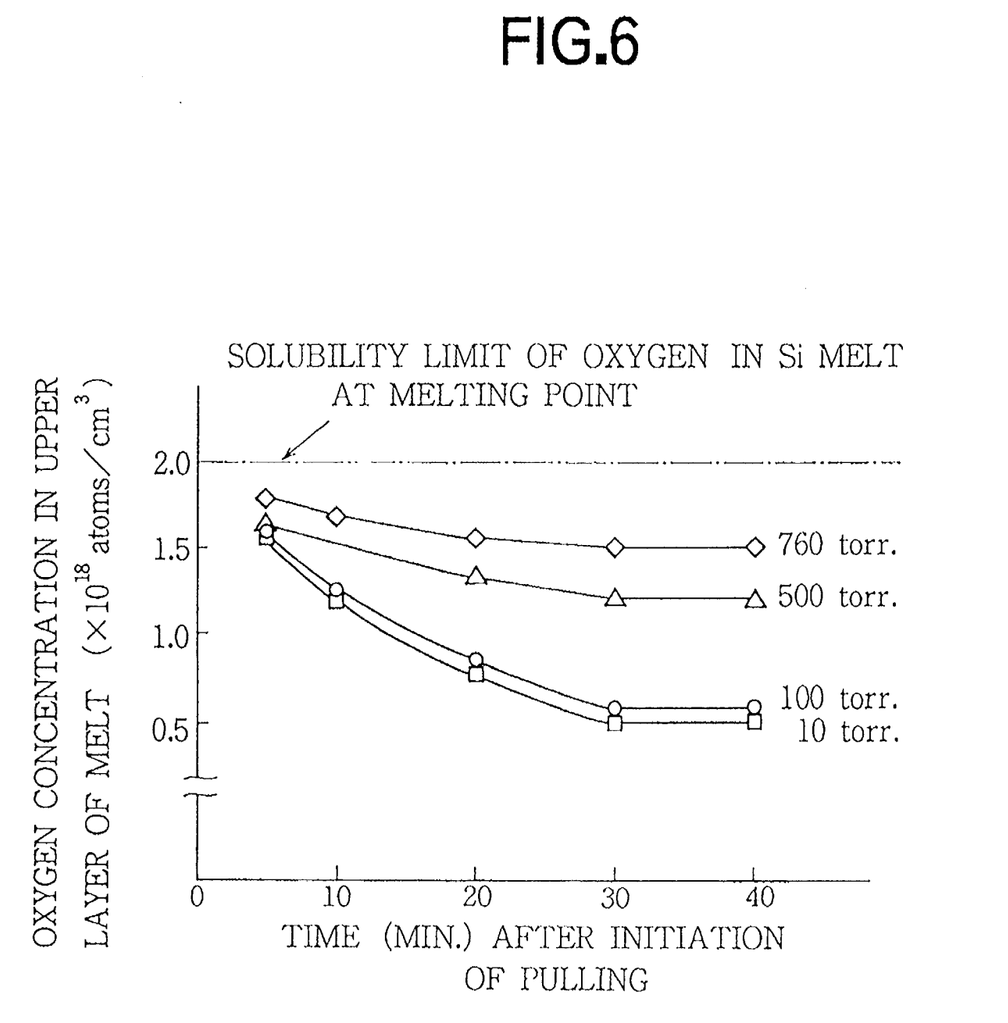
FIG. 6 is a diagram illustrating the chronological change of oxygen concentration in the upper layer of a Si melt in Example 2.

Oxygen concentration in the upper layer of the melt was periodically investigated after the operations for the growth of a single crystal had started, to search the chronological change of the oxygen concentration $C_2$. In this case, the atmospheric pressure was varied to search the effect of the atmospheric pressure P on the change of the oxygen concentration $C_2$. The results are shown in FIG. 6. It is noticed from FIG. 6 that the reduction of oxygen concentration $C_2$ becomes smaller as the higher atmospheric pressure P. The oxygen concentration $C_2$ was remarkably reduced in response to the decrease of the atmospheric pressure P.

The oxygen concentration in the upper layer of the melt can be controlled by the pressure of the atmosphere to which the melt is exposed, as shown in FIG. 6. The oxygen concentration $C_2$ in the upper layer of the melt has the close relationship with the oxygen concentration $C_3$ of a single crystal to be obtained, as shown in Table 2. In short, it is recognized that a single crystal having oxygen concentration adjusted at a predetermined level can be obtained by controlling the atmospheric pressure P.

Figure 7:
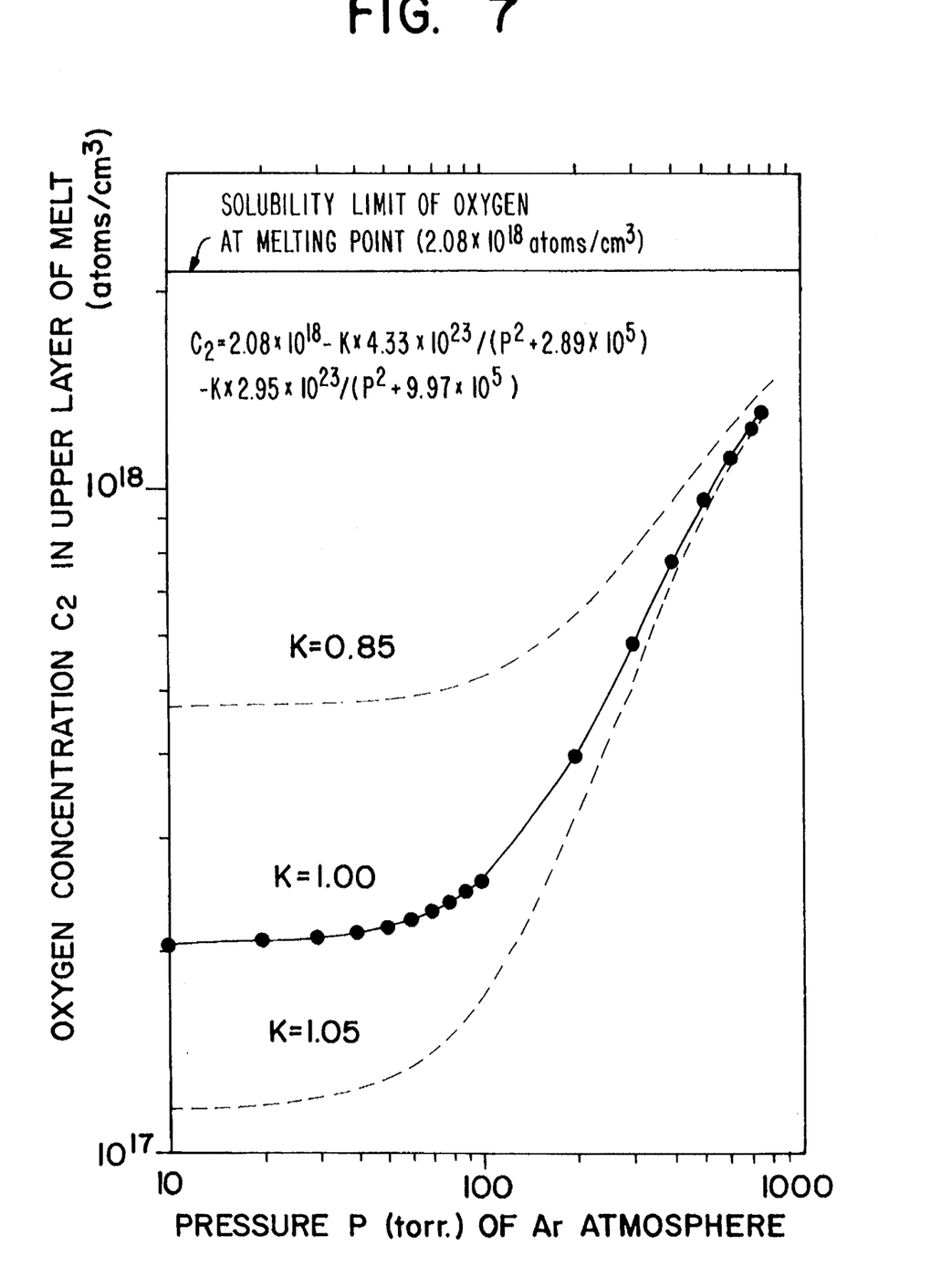
FIG. 7 is a diagram illustrating the effect of an atmospheric pressure on oxygen concentration in the upper layer of a Si melt in Example 2.

The zone for the growth of a single crystal comes to a stationary state in 30 min. after operations for pulling up the single crystal are started. The pressure P of an Ar atmosphere was varied to control oxygen concentration $C_2$ in the upper layer of the melt held in the stationary state, to search the effect of the atmospheric pressure P on the oxygen concentration $C_2$ in the upper layer of the melt. The results are shown in FIG. 7.

The transfer of oxygen diffused from the surface of the Si melt is regulated by the diffusion in the melt. The evaporation speed y of oxygen evaporated from the unit surface of the melt is defined by the formula of $y=D(C_1-C_2)\delta_y$ based on Nernst' formula, wherein $C_1$ is the oxygen concentration of the melt itself, $C_2$ is the oxygen concentration in the upper layer of the melt, D is a diffusion coefficient ($\approx 5.0\times 10^{-4}$ cm$^3$/sec.) of oxygen at a melting point, and $\delta_y$ is the averaged thickness ($\approx 0.01$ cm) of a diffusion layer in contact with the surface of the melt.

On the other hand, the oxygen concentration $C_1$ of the melt itself has the relationship defined by the formula of $x=D(C_d-C_1)\delta_x$ with the speed x of oxygen transferring from the boundary between the quartz crucible and the melt, and the concentration $C_d$ of oxygen dissolved from the quartz crucible. In the formula, $\delta_x$ represents the averaged thickness ($\approx 0.02$ cm) of a diffusion layer at the boundary between the quartz crucible and the melt.

Accordingly, the oxygen concentration $C_2$ in the upper layer of the melt is represented by the formula of $C_2=C_d-(\delta_x \cdot x+\delta_y \cdot y)/D$. The evaporation speed y is in inverse proportion to the square of the atmospheric pressure P, presuming the ideal condition wherein the oxygen concentration of the melt is in equilibrium state when the atmospheric pressure is constant. The formula (1) abovementioned is obtained by inserting the data shown in Table 2 and FIG. 6 into the formula of $C_2=C_d-(\delta_x \cdot x+\delta_y \cdot y)/D$.

The obtained formula (1) is used for stabilizing the oxygen concentration of a single crystal at a high level, as follows:

The atmospheric pressure P is adjusted according to the formula (1), to maintain the oxygen concentration $C_1$ of the melt itself at a value corresponding to the atmospheric pressure P. Hereby, the oxygen concentration $C_3$ of an obtained single crystal is stabilized within the narrow range of $(0.5-1.3)\times 10^{18}$ atoms/cm$^3$.

EXAMPLE 3

Pure Si 2.5 kg was received in a crucible of 400 mm in diameter and 350 mm in height, and heated with with a difference of 50° C. in temperature distribution along a vertical direction so as to hold the surface of a melt at 1450° C. After the Si melt was held for 30 min. under this temperature condition, pure Sb 150 g was added to the melt. The melt was further held for 30 min. under the same temperature condition. Hereby, there was prepared a Si melt doped with Sb at objective concentration of 0.14 atm. %.

The operation to pull up a single crystal from the Sb-doped Si melt was started in an Ar atmosphere, while changing the flow speed V of Ar gas within the range of 0.045–3.4 m/sec.. The obtained single crystal was sliced to a test piece of 2 mm in thickness. The oxygen concentration of the test piece was detected by SIMS method. The results are shown in FIG. 8.

Figure 8:
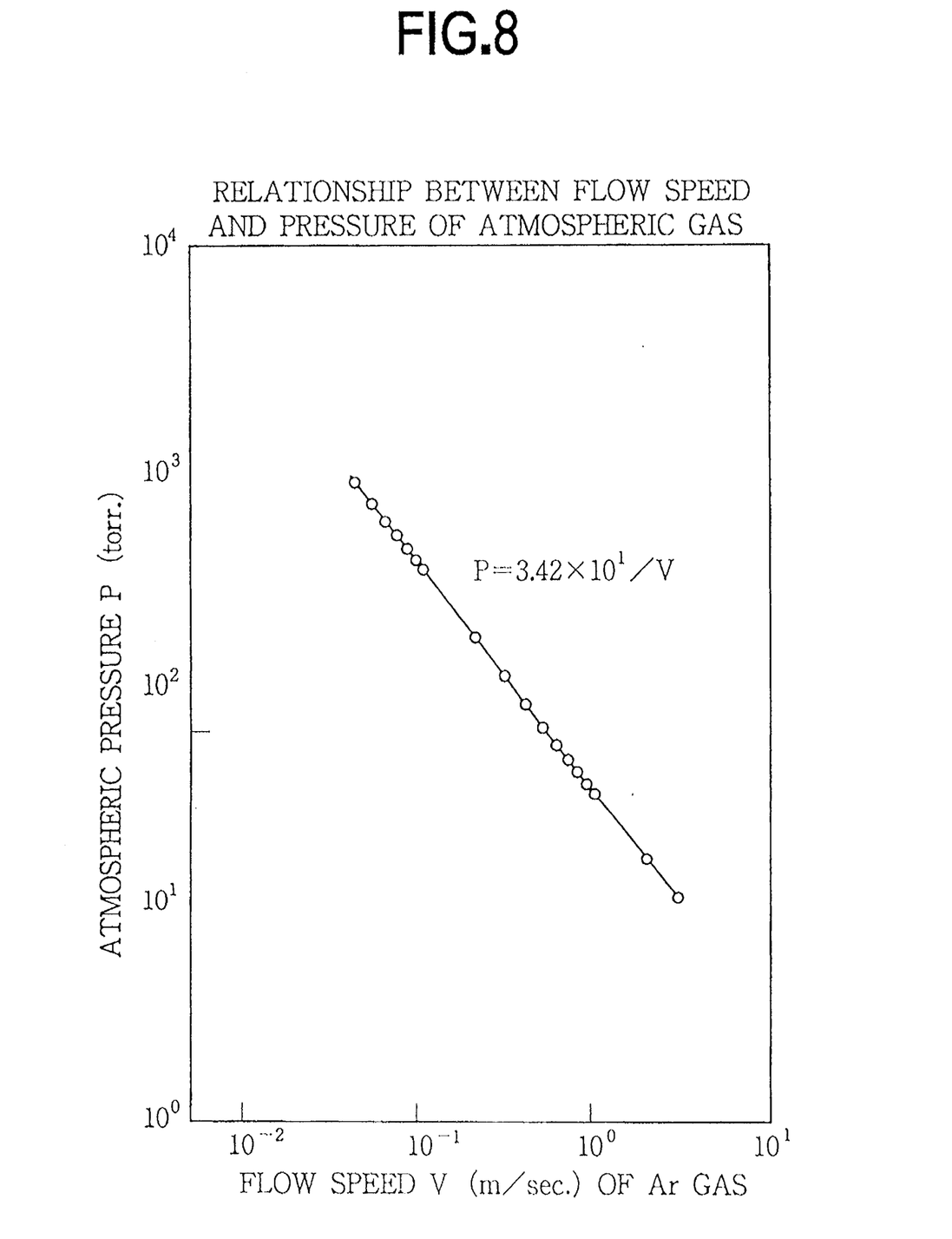
FIG. 8 is a diagram illustrating the relationship between the flow speed of atmospheric gas and an atmospheric pressure in Example 3.

It is noticed from FIG. 8 that the atmospheric pressure P is in inverse proportion to the flow speed V and represented by the formula of P=f/V. The coefficient f was $3.42\times 10^3$ in this Example using the quartz crucible of 400 mm in diameter. When the atmospheric pressure P was controlled by the flow speed V according to the formula of P=f/V, the calculated oxygen concentration in the upper layer of the melt was maintained at a value corresponding to the atmospheric pressure P according to the formula (1). As a result, the oxygen concentration of an obtained single crystal was stabilized within the range of $(0.6-1.3)\times 10^{18}$ atoms/cm$^3$, and the single crystal had excellent quality with high reliability.

EXAMPLE 4

Pure Si 120 g was received in a crucible of 50 mm in diameter and 60 mm in height, and heated with with a difference of 50° C. in temperature distribution along a vertical direction so as to hold the surface of a melt at 1450° C. After the Si melt was held for 30 min. under this temperature condition, pure Sb 0.7 g was added to the melt. The melt was further held for 30 min. under the same temperature condition. Thereafter, the melt was cooled to 1350° C. at a cooling speed of 200° C./hr. and then to a room temperature at a cooling speed of 50° C./hr.. Hereby, there was prepared a Si melt doped with Sb at objective concentration of 0.8 atm. %.

The Sb-doped Si melt was heated at 1426°–1542° C. in each atmosphere of No, Ar, Kr and Xe. After the melt was held for 90 min. at the same temperature, the operation to pull up a single crystal was started. The condition for the growth of a single crystal was controlled during the pulling operation so as to maintain the oxygen concentraion in the upper layer of the melt at a constant value. The oxygen concentration of the melt itself was detected during the pulling operation.

Each obtained single crystal was sliced to a test piece of 2 mm in thickness, and the oxygen concentration of the test piece was detected by SIMS method.

The oxygen concentration of each test piece pulled up from the melt held in the Ar atmosphere had the same relationship as that shown in Table 2 in Example 2.

Figure 9:
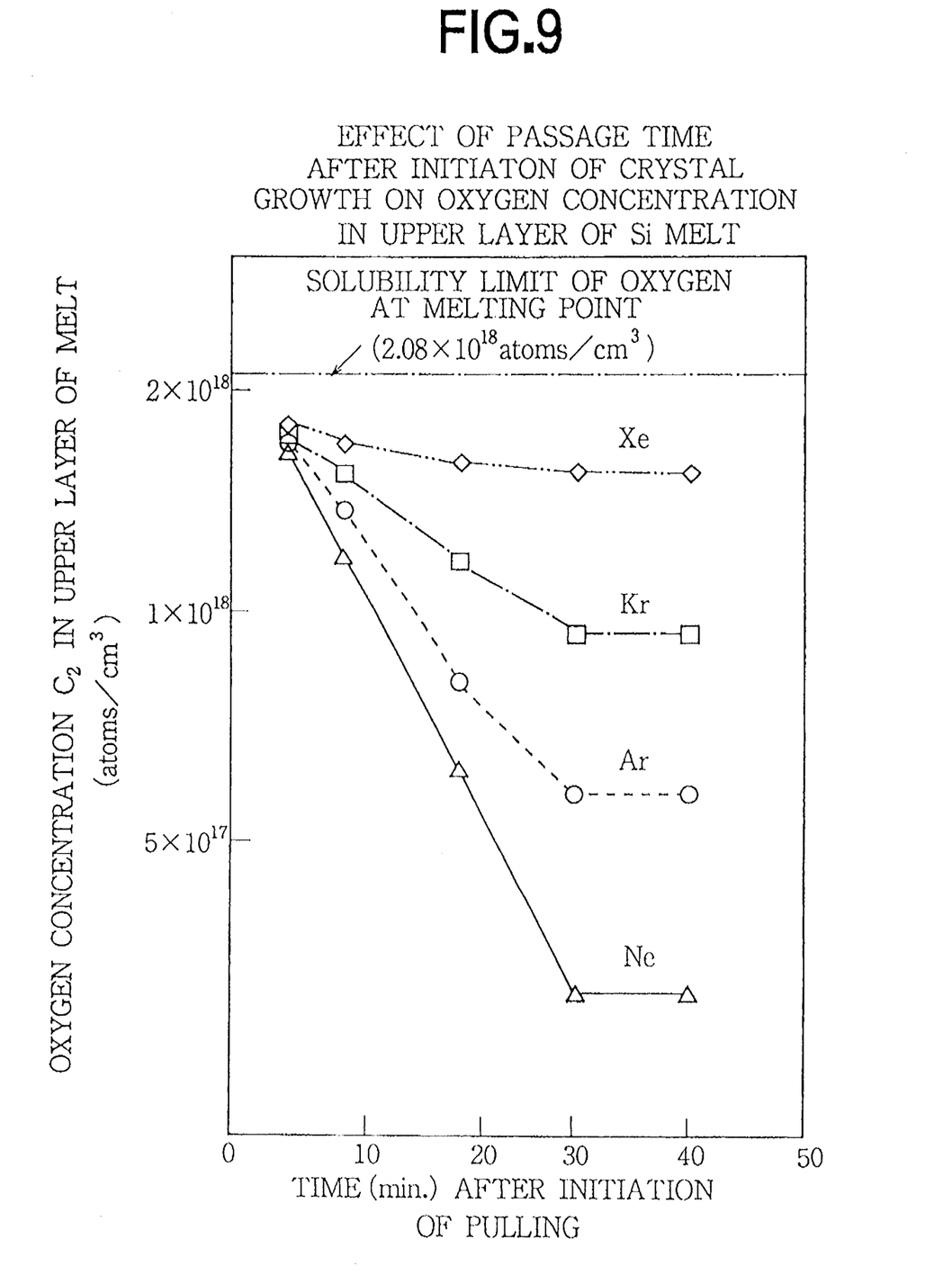
FIG. 9 is a diagram illustrating the effect of a passage time after the initiation of crystal growth on oxygen concentration in response to the kind of rare gas in Example 4.

The oxygen concentration in the upper layer of the melt was periodically calculated after the initiation of the pulling operation, to search the effect of the kind of rare gas on the chronological change of the oxygen concentration. The results are shown in FIG. 9. It is apparently noticed from FIG. 9 that the oxygen concentration $C_2$ in the upper layer of the melt was remarkably reduced as the rare gas for the atmosphere had a smaller mass. On the other hand, the tendency to suppress the reduction of the oxygen concentration was recognized by using a rare gas having a larger mass as the atmospheric gas.

A Si single crystal was pulled up from a Si melt held at 1450° C. in an atmosphere of 30 torr. using Kr as an atmospheric gas. The oxygen concentration of the obtained single crystal was stabilized within the range of $(9.5-11.0)\times 10^{17}$ atoms/cm$^3$. Another single crystal was pulled up in the same way but using Ne as the atmospheric gas. The oxygen concentration of the single crystal obtained in this case was $(3-5)\times 10^{17}$ atoms/cm$^3$. Both of the single crystals having the oxygen concentration stabilized at a high level were useful as semiconductor substrates for electronic devices excellent in quality and reliability.

EXAMPLE 5

Pure Si 120 g was received in a crucible of 50 mm in diameter and 60 mm in height, and heat treated in the same way as that in Example 4, to prepare a Si melt doped with Sb at objective concentration of 0.8 atm. %.

The Sb-doped Si melt was heated at 1426°–1542° C. in an Ar atmosphere. After the melt was held for 90 min. at the same temperature, the operation to pull up a single crystal was started. During the pulling operation, the oxygen concentration in the upper layer of the melt was calculated, and the oxygen concentration of the melt itself was controlled so as to continue the growth of the single crystal under the same condition. The obtained single crystal was sliced to a test piece of 2 mm in thickness, and the oxygen concentration of the test piece was detected by SIMS method.

The oxygen concentration of the test piece had the same dependency as that shown in Table 2 of Example 2 on the oxygen concentration in the upper layer of the melt.

Figure 10:
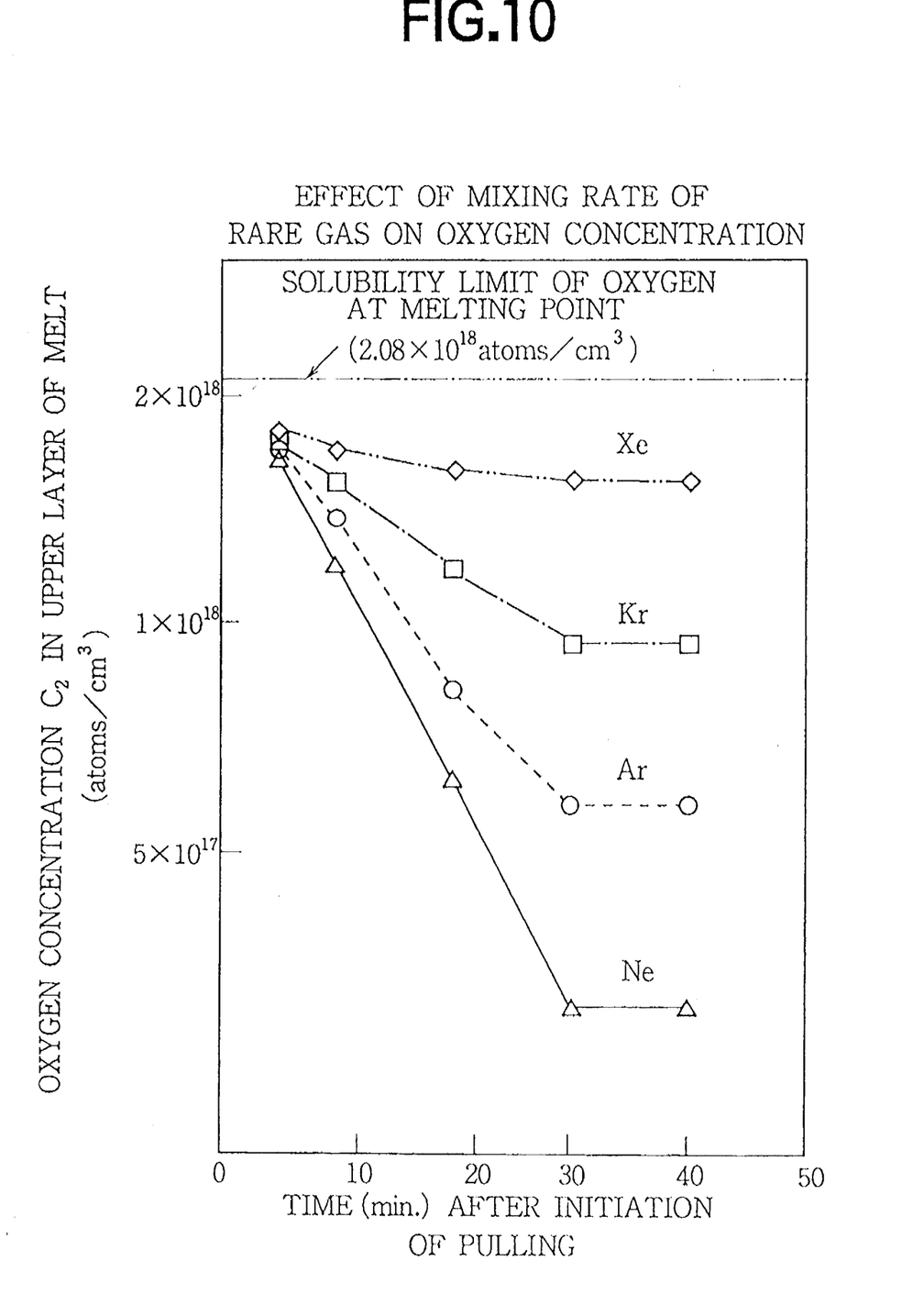
FIG. 10 is a diagram illustrating the effect of the mixing rates of rare gas having a larger mass on oxygen concentration in Example 5.

The oxygen concentration in the upper layer of the melt was periodically calculated after the initiation of the pulling operation, to investigate the chronological change of the oxygen concentration. In this case, pure Ar and the mixture of Ar with Kr were used as the atmospheric gas, and the amount of Kr mixed with Ar was varied to search the effect of the composition on the oxygen concentration in the upper layer of the melt. The results are shown in FIG. 10. It is noticed from FIG. 10 that the oxygen concentration was reduced as the increase of the mixing ratio of Kr.

Another single crystal was pulled up from the melt under the same conditions but using the mixture of Ar and Ne. In this case, the oxygen concentration was remarkably reduced as the increase of the mixing ratio of Ne, as shown in FIG. 11.

Figure 11:
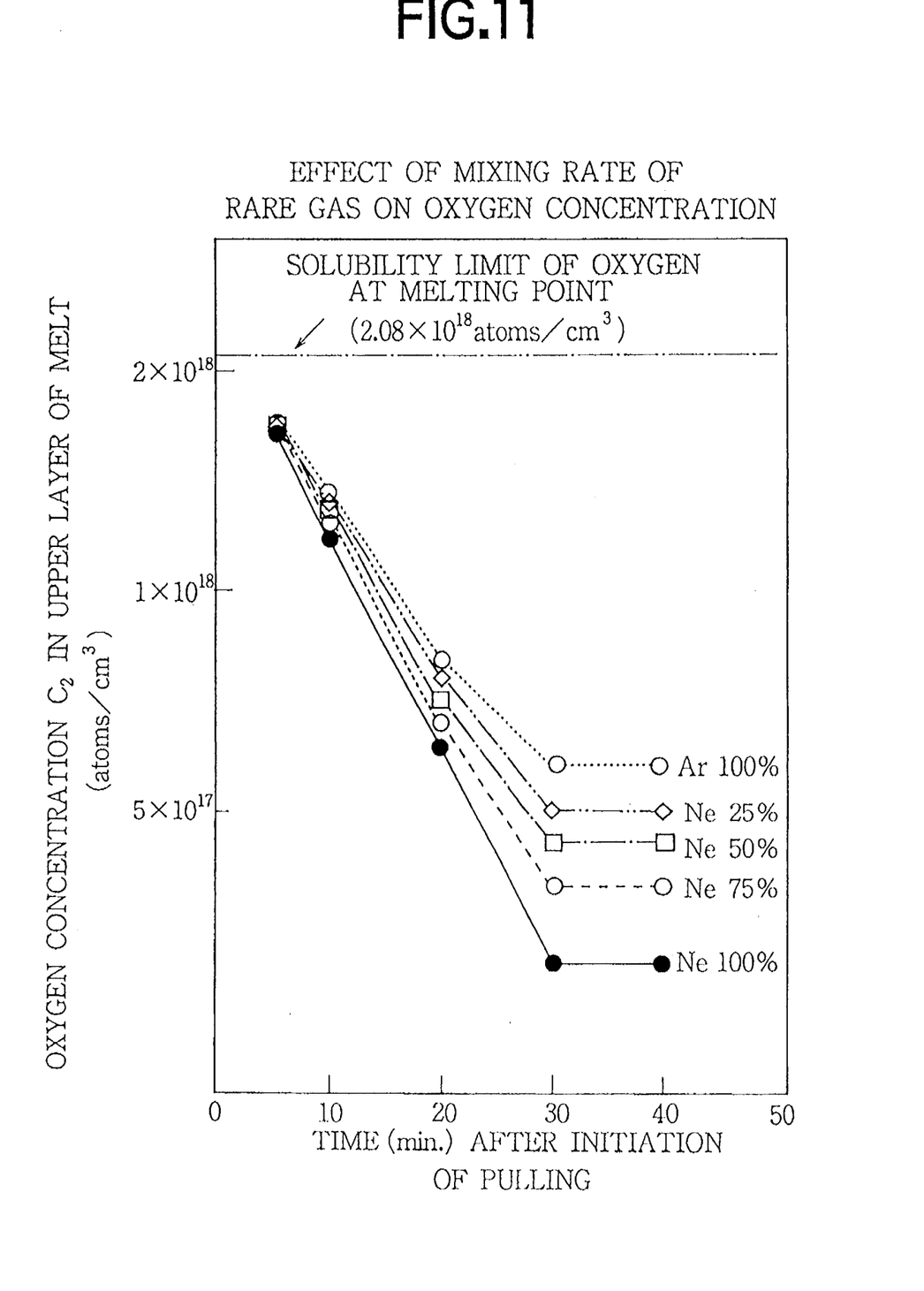
FIG. 11 is a diagram illustraing the effect of the mixing rates of rare gas having a smaller mass on oxygen concentration in Example 5.

When the results in FIGS. 10 and 11 are comapred together, it is apparently noticed that the oxygen concentration $C_2$ in the upper layer of the melt can be controlled by the rate of Kr or Ne to be mixed to Ar. The oxygen concentration $C_2$ in the upper layer of the melt had the close relationsip with the oxygen concentration of a single crystal to be obtained. Hence, a single crystal having oxygen concentration adjusted at an objective value can be obtained by predeterming the rates of Kr and Ne to be mixed to Ar in response to objective oxygen concentration and continuing the crystal growth in the Ar—Kr or Ar—Ne atmosphere in which the mixing rate or Kr or Ne is changed in response to the calculated oxygen concentration in the upper layer of the melt.

The actual oxygen concentration of a single crystal had the relationship shown in Table 3 with the composition of the atmospheric gas. The conditions for the crystal growth in Table 3 were an atmospheric pressure of 30 torr., the surface temperature of the melt at 1450° C. and a pulling speed of 1.0 m/hr. Any single crystal had high oxygen concentration controlled within a narrow range. The single crystals were useful as semiconductor substrates for electronic devices excellent in quality and reliability.

TABLE 3

RELATIONSHIP BETWEEN COMPOSITION OF ATMOSPHERIC GAS AND OXYGEN CONCENTRATION OF SINGLE CRYSTAL

| Additional Rare Gas | Mixing Rate (Vol. %) | Oxygen Concentration (atoms/cm³ × 10¹⁷) | | |
|---|---|---|---|---|
| | | Objective | Actual | Deviation |
| Kr | 0 | 5.8 | 5.8 | 0 |
| | 25 | 6.7 | 6.5 | 0.2 |
| | 50 | 7.6 | 7.5 | 0.1 |
| | 75 | 8.5 | 8.6 | 0.1 |
| | 100 | 9.4 | 9.5 | 0.1 |
| Ne | 0 | 5.8 | 5.8 | 0 |
| | 25 | 5.1 | 5.0 | 0.1 |
| | 50 | 4.5 | 4.5 | 0 |
| | 75 | 3.8 | 3.9 | 0.1 |
| | 100 | 3.1 | 3.0 | 0.1 |

EXAMPLE 6

A single crystal was pulled up from the Si melt in the same way as that in Example 2, but the internal pressure of the chamber 1 was varied during the crystal growth to search the effect of the atmospheric pressure on the oxygen concentraion in the upper layer of the melt. The result is shown in Table 4. It is noticed from Table 4 that the oxygen concentration was reduced as the atmospheric pressure was lower, since the lower atmospheric pressure accelerated the evaporation of oxides from the melt. The oxygen concentration became higher as the increase of the atmospheric pressure.

TABLE 4

EFFECT OF ATMOSPHERIC PRESSURE ON OXYGEN CONCENTRATION IN UPPER LAYER OF Si MELT

| Atmospheric Pressure | 10 | 50 | 100 | 200 | 500 | 760 |
|---|---|---|---|---|---|---|
| Oxygen Concentration | 2.1 | 2.2 | 2.6 | 4.0 | 9.6 | 13.1 |

NOTE:
Atmospheric pressure is shown by torr.
Oxygen Concentration is shown by × 10¹⁷ atoms/cm³.

The data in Tables 2 and 4 were previously inputted to the control unit 18 (shown in FIG. 4). The atmosphere in the chamber was controlled during the crystal growth consulting with the inputted data. In this case, objective oxygen concentration in the upper layer of the melt was set at $4.0 \times 10^{17}$ atoms/cm³. The atmospheric pressure in the chamber 1 was changed within the range of 10–50 torr. in response to the deviation of an oxygen value calculated by the control unit 18 from the objective value. The obtained single crystal had oxygen concentration controlled within the narrow range of $(7.0 \pm 0.2) \times 10^{17}$ atoms/cm³.

EXAMPLE 7

This example is aimed at investigating the effect of the rate of He, Ne, Kr or Xe to be mixed to Ar on oxygen concentration in the upper layer of a melt. Other conditions for the crystal growth were held the same as those in Example 6. The oxygen concentration was changed in response to the kind of rare gas and its mixing rate, as shown in Table 5. It is noticed from Table 5 that the oxygen concentration was reduced when He or Ne having a smaller mass was mixed to Ar, while the oxygen concentration was increased when Kr or Xe having a larger mass was mixed to Ar. The changing rate of the oxygen concentration had a close relationship with the mixing rate of each rare gas.

TABLE 5

RELATIONSHIP BETWEEN MIXING RATE OF RARE GAS AND OXYGEN CONCENTRATION IN UPPER LAYER OF MELT

| Mixing Rate (Vol. %) | Oxygen Concentration (atoms/cm³ × 10¹⁷) | | | |
|---|---|---|---|---|
| | He | Ne | Kr | Xe |
| 10 | 2.4 | 2.6 | 3.2 | 3.6 |
| 20 | 1.9 | 2.3 | 3.6 | 4.3 |
| 30 | 1.5 | 2.1 | 3.9 | 5.1 |
| 40 | 1.0 | 1.8 | 4.3 | 5.8 |
| 50 | 0.6 | 1.5 | 4.6 | 6.6 |

The data in Table 5 together with the data in Tables 2 and 4 were previously inputted to the control unit 18 (shown in FIG. 4). The oxygen concentration in the upper layer of the melt was periodically calculated during crystal growth. The atmospheric pressure was changed within the range of 10–30 torr. in response to the calculation result, while the mixing rate of He was changed within the range of 0–30 vol.

%. The obtained single crystal had oxygen concentration controlled within the narrow range of $(9.0\pm0.2)\times10^{17}$ atoms/cm$^3$.

Another single crystal was pulled up while changing the atmospheric pressure within the range of 10–30 torr. and the mixing rate of Kr within the range of 0–40 vol. %. The single crystal obtained in this case had oxygen concentration controlled within the narrow range of $(6.0\pm0.3)\times10^{17}$ atoms/cm$^3$.

It is recognized from this Example that single crystals having oxygen concentration stabilized at a higher level can be produced by changing the atmospheric pressure and the composition of the atmospheric gas as occasion demands. Hereby, the oxygen concentration of the Si single crystal is adjusted to a proper value over the broad range of $(0.3-1.5)\times10^{18}$ atoms/cm$^3$.

According to the present invention as abovementioned, Group-V element such as Sb is added to the melt from which a single crystal is to be pulled up. The oxygen concentration of the melt is changed in response to the amount of Group-V element added to the melt, so that the oxygen concentration of an obtained single crystal can be controlled by the amount of Group-V element.

Since oxygen is diffused as an oxide having a large vapor pressure from the surface of the melt, the evaporation of the volatile oxide can be controlled by atmospheric conditions, e.g. an atmospheric pressure, a kind of rare gas, the composition of atmospheric gas and so on. Hereby, the oxygen concentration of the melt is maintained at a high level.

A single crystal pulled up from such a melt by Czochralski method has the very high oxygen concentration which has not been attained in a conventional method. In addition, oxygen concentration in the upper layer of the melt is controlled with high accuracy by changing the atmosphric conditions. Hereby, the oxygen concentration of the obtained single crystal is stabilized at a high level.

The high oxygen concentration is effective for the formation of fine faults serving as a trap for the leakage of electricity during the operation of a semiconductor device or a gettering center to capture heavy metal impurities. Consequently, the single crystal is useful as a semiconductor substrate for an electronic device, e.g. a power transistor sensitive to the leakage of electricity or a bipolar transistor using a channel formed in the substrate.

What is claimed is:

1. A pull method for the growth of a single crystal having a high oxygen concentration from a Si melt, comprising:

adding a Group-V element in a controlled amount to a Si melt to adjust the oxygen concentration of said Si melt at a value corresponding to said controlled amount, said melt having an atmosphere above it, carrying a seed crystal into contact with the surface of said Si melt so as to grow a single crystal having a crystalline orientation transferred from said seed crystal, and pulling up said single crystal from said Si melt, while controlling said oxygen concentration in the surface layer of said Si melt by changing a condition of said atmosphere, whereby said single crystal has an oxygen concentration stabilized within a narrow range.

2. The pull method according to claim 1, further comprising detecting the amount of Group V element added to the melt and detecting the amount of Group V element evaporated from the melt, calculating the content of Group V element in said melt, and comparing said content with the oxygen concentration.

3. The pull method according to claim 1, further comprising calculating the oxygen concentration of the upper layer of said melt by the formula:

$$C = 2.08 \times 10^{18} - K \times \left( \frac{4.33 \times 10^{23}}{P^2 + 2.89 \times 10^5} + \frac{2.95 \times 10^{23}}{P^2 + 9.97 \times 10^5} \right)$$

4. A pull method according to claim 1 further comprising:

detecting reaction conditions of atmospheric pressure, oxygen concentration and oxygen partial pressure during growth of said single crystal, to thereby obtain detected reaction conditions, changing said reaction conditions based on said detected reaction conditions so as to obtain a single crystal having an oxygen concentration stabilized within a narrow range.

5. The pull method according to claim 1, further comprising detecting the partial pressure of oxygen and the atmospheric pressure, calculating the oxygen concentration in an upper layer of said melt during the growth of a single crystal from said partial pressure and said atmospheric pressure to obtain a calculation result, comparing said calculation result with an objective preset oxygen value, obtaining a difference between the calculation value and the objective value, and converting said difference to a control signal representing the proper atmospheric pressure.

* * * * *